(12) United States Patent
Khadilkar et al.

(10) Patent No.: US 8,815,636 B2
(45) Date of Patent: Aug. 26, 2014

(54) OXIDES AND GLASSES FOR USE WITH ALUMINUM BACK SOLAR CELL CONTACTS

(75) Inventors: Chandrashekhar S. Khadilkar, Broadview Heights, OH (US); Srinivasan Sridharan, Strongsville, OH (US); Nazarali Merchant, San Diego, CA (US); Jackie Davis, Cleveland, OH (US); Aziz S. Shaikh, San Diego, CA (US); Hong Jiang, Irvine, CA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 0 days.

(21) Appl. No.: 13/340,840

(22) Filed: Dec. 30, 2011

(65) Prior Publication Data

US 2012/0174974 A1    Jul. 12, 2012

Related U.S. Application Data

(60) Provisional application No. 61/430,200, filed on Jan. 6, 2011.

(51) Int. Cl.
*H01L 21/00* (2006.01)

(52) U.S. Cl.
USPC .......................................................... 438/98

(58) Field of Classification Search
USPC .................. 136/256; 257/E21.627, E21.641; 438/98
See application file for complete search history.

(56) References Cited

U.S. PATENT DOCUMENTS

| | | | |
|---|---|---|---|
| 7,771,623 B2 | 8/2010 | Young et al. | |
| 8,309,844 B2 * | 11/2012 | Merchant et al. | 136/256 |
| 2006/0102228 A1 | 5/2006 | Sridharan et al. | |
| 2006/0289055 A1 | 12/2006 | Sridharan et al. | |
| 2009/0056798 A1 | 3/2009 | Merchant et al. | |
| 2009/0101190 A1 | 4/2009 | Salami et al. | |
| 2011/0232747 A1 * | 9/2011 | Mikeska et al. | 136/256 |
| 2012/0031484 A1 * | 2/2012 | Matsuno et al. | 136/256 |
| 2012/0152342 A1 * | 6/2012 | Roelofs | 136/256 |

* cited by examiner

*Primary Examiner* — Asok K Sarkar
(74) *Attorney, Agent, or Firm* — Blank Rome LLP (57) ABSTRACT

Solar cell contacts having good electrical performance are made by a process involving: (a) providing a silicon wafer substrate; (b) providing a paste comprising: (i) aluminum, (ii) glass frit, and (iii) a separate and distinct amount of at least one oxide, such that, together with the aluminum, the glass frit and oxide forms a paste having an exothermic reaction peak, at a temperature of at least 660° C. to less than 900° C., (c) applying the paste to the silicon wafer substrate to form a coated substrate, and (d) firing the coated substrate for a time and at a temperature sufficient to sinter the aluminum and fuse the glass frit and oxide.

17 Claims, 1 Drawing Sheet

OXIDES AND GLASSES FOR USE WITH ALUMINUM BACK SOLAR CELL CONTACTS

FIELD OF THE INVENTION

This invention relates to oxide additions to back contact aluminum pastes to improve the electrical performance of a solar cell contact made from a fired paste. Certain oxides and combinations of oxides react exothermically with aluminum or aluminum alloys in a back contact in order to increase wafer temperature to ensure more reliable and uniform back contacts. Oxide additives described here can be added as an oxide material (for example cobalt oxide $CO_3O_4$). Oxide precursors, such as cobalt acetate or cobalt acetyl acetonate, etc., can also be added, which during heating in air will decompose to form the corresponding oxide (e.g. $CO_3O_4$).

BACKGROUND

Solar cells are generally made of semiconductor materials, such as silicon (Si), which convert sunlight into useful electrical energy. A solar cell contact is in generally made of thin wafers of Si in which the required pn junction is formed by diffusing phosphorus (P) from a suitable phosphorus source into a p-type Si wafer (for example boron doped Silicon wafer) to form n-type region. The side of the silicon wafer on which sunlight is incident (n-side) is generally coated with an anti-reflective coating (ARC) to prevent reflective loss of sunlight. This ARC increases the solar cell efficiency. A two dimensional electrode grid pattern known as a front contact makes a connection to the n-side of silicon, and a coating of predominantly aluminum (Al) makes connection to the p-side of the silicon (back contact). Further, contacts known as silver rear contacts, made out of silver or silver-aluminum paste are printed and fired on the p-side of silicon to enable soldering of tabs that electrically connect one cell to the next in a solar cell module. These contacts are the electrical outlets from the pn junction to the outside load.

The additives described in this invention react with Al to form reliable and high efficiency back contacts. The reactions between additives and Al results in an earlier onset of removal of the thin surface oxide layer on Al particulates. The Al pastes containing the additives described hereinbelow offers a wider processing window and higher electrical performance.

SUMMARY OF THE INVENTION

The invention describes a role played by certain oxides (and oxide precursors which decompose to form corresponding oxides during heating) to improve the aluminum back contacts to silicon solar cells. In particular, metal oxide additions increase firing temperature as well as uniformity of firing temperature in order to form a highly efficient solar cell contact. The cell improvements are reflected in cell efficiency (Eff), fill factor (FF), cell open circuit voltage, (Voc) and cell short circuit current, (Isc). Electrical performance of solar cells made therewith, as measured by low series resistance ($R_S$), high shunt resistance ($R_{sh}$) and high efficiency ($\eta$) are also facets of the invention.

In particular, an embodiment of the invention is a method of improving the electrical performance of an aluminum back contacted silicon solar cell, comprising: (a) providing a silicon wafer substrate, (b) providing a paste comprising (i) aluminum, (ii) glass frit, and (iii) a separate and distinct amount of at least one oxide of a metal selected from the group consisting of Ag, Al, Ba, Bi, Ca, Co, Cr, Cu, Fe, K, Li, Mg, Mn, Mo, Na, Nd, Ni, Sb, Si, Sn, Sr, Ta, V, Zn, Zr, and combinations thereof, such that, together with the aluminum, the glass frit and oxide forms a paste having an exothermic reaction peak, when measured with differential thermal analysis at a heating rate of 20° C. per minute in air, at a temperature of at least 660° C. to less than 900° C., with a sample size of 5 to 200 mg when run on a Mettler-Toledo TGA/SDTA 851e, (c) applying the paste to the silicon wafer substrate to form a coated substrate, and (d) firing the coated substrate for a time and at a temperature sufficient to sinter the aluminum and fuse the glass frit and oxide.

Another embodiment of the invention is a method of reducing the reaction temperature of a conductive paste sintering reaction, comprising: (a) providing a silicon wafer substrate, (b) providing a paste comprising (i) aluminum, (ii) glass frit, and (iii) a separate and distinct amount of at least one oxide of a metal selected from the group consisting of Ag, Al, Ba, Bi, Ca, Co, Cr, Cu, Fe, K, Li, Mg, Mn, Mo, Na, Nd, Ni, Sb, Si, Sn, Sr, Ta, V, Zn, Zr, and combinations thereof, such that, together with the aluminum, the glass frit and organometallic compound forms a paste having an exothermic reaction peak, when measured with differential thermal analysis at a heating rate of 20° C. per minute in air, at a temperature of at least 660° C. to less than 900° C., with a sample size of 5 to 200 mg when run on a Mettler-Toledo TGA/SDTA 851e, (c) applying the paste to the silicon wafer substrate to form a coated substrate, and (d) firing the coated substrate for a time and at a temperature sufficient to sinter the aluminum and fuse the glass frit and oxide, wherein the combination of aluminum, glass frit and at least one oxide is such that the sintering temperature of the paste is at least 5° C. lower than it would otherwise be if the at least one oxide were not present.

The relative amounts of glass, aluminum and oxide used to run the DTA test can be varied to obtain clear indication of the exothermic peak. DTA samples typically consist of 5-8 grams of glass, 2-5 grams of aluminum power and 1-3 grams of aluminum. It is important to mix these components to obtain a homogeneous mixture for reproducible DTA analysis. The amount of sample used to conduct DTA test also helps to obtain a clear exothermic DTA peak whose peak temperature can be measured reproducibly. Typically 5-70 milligram of homogeneous sample is used to conduct DTA test, however as much as 200 milligrams can be used.

Still another embodiment of the invention is a method of reducing the reaction temperature of a conductive paste sintering reaction, comprising: (a) providing a silicon wafer substrate; (b) providing a paste comprising: (i) aluminum, (ii) glass frit, and (iii) a separate and distinct amount of at least one oxide, (iv) such that, together with the aluminum, the glass frit and inorganic oxide forms a paste having an exothermic reaction peak, when measured with differential thermal analysis at a heating rate of 20° C. per minute in air, at a temperature of at least 660° C. to less than 900° C., (c) applying the paste to the silicon wafer substrate to form a coated substrate, and (d) firing the coated substrate for a time and at a temperature sufficient to sinter the aluminum and fuse the glass frit and oxide, wherein the combination of aluminum, glass frit and at least one oxide is such that the sintering temperature of the paste is at least 5° C. lower than it would otherwise be if the at least one oxide were not present.

Still another embodiment of the invention is a method of improving the electrical performance of an aluminum back contacted silicon solar cell, the method comprising: (a) providing a silicon wafer substrate; (b) providing a paste comprising: (i) aluminum, (ii) glass fit, and (iii) a separate and distinct amount of at least one oxide, which, when fired, provides an exothermic enthalpy of 1 to 25 kilojoules (kJ) per gram of paste aluminum reacted at 700° C. to form a coated substrate, (c) applying the paste to the silicon wafer substrate to form a coated substrate, and (d) firing the coated substrate for a time and at a temperature sufficient to sinter the aluminum and fuse the glass frit and oxide.

Still another embodiment is a solar cell comprising, prior to firing, (a) a silicon wafer substrate; (b) a paste comprising (i) aluminum, (ii) glass frit, and (iii) an amount of at least one oxide, which, when fired, provides an exothermic enthalpy change of 1 to 25 kilojoules per gram of paste aluminum per second to form a coated substrate, wherein the combination of aluminum, glass frit and at least one oxide is such that the sintering temperature of the paste is at least 5° C. lower than it would otherwise be if the at least one oxide were not present.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

Figure 1:
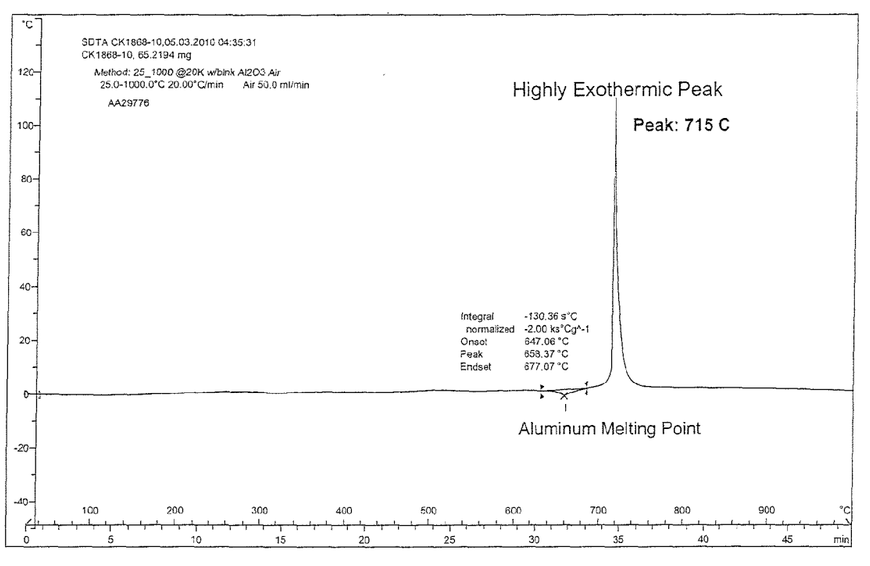
FIG. 1 is a DTA of 5:1:1 glass I frit, aluminum and cobalt oxide (approximately 65 milligrams). Strong exothermic peak at ~715° C. is shown in the FIGURE along with melting (endothermic) peak at ~668° C. for aluminum metal melting.

Broadly, the invention provides a solar cell comprising a contact. The contact is made from a mixture wherein prior to firing, the mixture comprises at least one aluminum source, and about 0.1 to about 10 wt % of a glass component. The content of aluminum is about 60 wt % to about 95 wt % of the mixture.

The aluminum back contact of a solar cell makes contact with both the silicon wafer and the Ag/Al rear contact layer. In a back contact, the metal component preferably comprises aluminum, and the glass component may be one of several types. Bismuth based glasses, borosilicates, and alkali titanium silicate glasses each have certain advantages over the prior art when used in a solar cell back contact.

Broadly, thick film pastes containing aluminum and glass frit are used to make back contacts for silicon-based solar cells to conduct to an external load the current generated by exposure to light. While the paste is generally applied by screen-printing, methods such as extrusion, pad printing, ink jet printing, and hot melt printing may also be used. Further with suitable organics modifications the mixture of the present invention could be applied by tape lamination techniques, as taught in commonly owned U.S. Pat. No. 7,547,369. Solar cells with screen-printed front contacts are fired to relatively low temperatures (550° C. to 850° C. wafer temperature; furnace set temperatures of 650° C. to 1000° C.) to form a low resistance contact between the p-side of an aluminum doped silicon wafer and an aluminum based paste. Methods for making solar cells are also envisioned herein.

Aluminum- and glass-containing back contacts are used to form low resistance ohmic contacts on the back side of the solar cell due to large area melting and resolidification of Al doped ($p^+$) epitaxially grown Si layer which increases the solar cell performance due to the production of an improved back surface field. For optimum performance a thick $p^+$ re-grown region is believed to be ideal. It is also believed that the rejection of metallic impurities from the epitaxially growing $p^+$ layer leads to high carrier lifetimes. These two factors are believed to increase the open circuit voltage, and more importantly, the open circuit voltage falls only slightly as the bulk resistivity increases. Therefore solar cell performance improves due to the formation of a substantial epitaxially re-grown $p^+$ layer in the Al back contact.

During crystalline silicon solar cell manufacturing, front silver based paste is applied to n-type silicon (phosphorus doped region) and aluminum back contact paste is applied to p-type (boron doped region) silicon. The back contact aluminum plays a key role in (1) improving the cell open circuit voltage, Voc; (2) in increasing the cell current by reducing the back contact recombination velocity, $S_{eff}$, by formation of a back surface field, BSF layer; and (3) also acts as a reflector for the unabsorbed light. All these factors lead to improvements in the overall cell efficiency and other electrical parameters. Both front contact silver and back contact aluminum pastes are fired at the same time in a belt furnace at ca. 800° C. at very rapid rate (180-240 inches per minutes) and the time at the peak firing temperature is of the order of only 1-10 seconds.

For a back contact, upon firing, a $p^+$ layer forms on the underlying silicon by liquid-phase epitaxy. This occurs during the resolidification of the aluminum-silicon (Al—Si) melt. High-bismuth lead-free and cadmium-free glasses allow low firing temperatures in making back contacts owing to their excellent flow characteristics relatively at low temperatures. Alkali-titanium-silicate glasses are another route to attain lower firing temperatures. While lead-glasses are often avoided for environmental reasons, they are sometimes used because they are the only route at present to certain properties, such as extremely low melting and wetting glasses. Relatively high-silicon, low bismuth lead-free and cadmium-free glasses provide suitable properties for back contacts, without excessive interaction with backside Si. Similarly, high-bismuth lead-free and cadmium-free glasses allow the formation of suitable lead-free silver rear contacts on backside Si with optimal interaction with both Si and back contact Al layer.

The additives of the invention provide heat to the aluminum paste through exothermic reactions which increase the wafer temperature in order to form reliable and high efficiency front and back contacts. Higher and more uniform back contact reaction temperature has following beneficial effects: (1) increases the thickness of the BSF layer; (2) increases the "doping" level of aluminum in the BSF layer; (3) makes the wafer temperature more uniform and improves the temperature distribution in the wafer—heat generated by localized exothermic reaction is very effectively distributed by high thermal conductivity molten aluminum metal or aluminum alloys; (4) improves the aluminum paste adhesion to silicon and (5) improves the front contact formation. This control of temperature and its uniformity is critical for other types of back contacts also where aluminum is applied over thin coatings of $Al_2O_3$, $SiO_2$, $Si_3N_4$ or their combinations as a continuous film or where via openings are made to make aluminum silicon contact.

The inventors herein have determined, by the use of Differential Thermal Gravimetric Analysis (DTA), X-Ray diffraction study and (XRD) and Scanning Electron Microscopy (SEM) the various parameters under which molten aluminum reacts with the glass constituent oxides and oxide or mixed oxide additives. The heat is generated by the exothermic reaction between the glass and additives and molten aluminum. The effectiveness of various oxides is calculated using the heats of reactions between the oxide and molten aluminum (for the back contact), between silicon and oxides for the front contacts, and removal of SiNx layer by calculating heats of reactions between $SiO_2$ and various oxides.

The present invention involves addition of inorganic compounds or organometallic compounds or mixtures thereof that react exothermically with molten aluminum metals or aluminum-silicon alloy (including Al-silicon eutectic alloy) or other aluminum alloys on solar cell substrates during firing to make solar cell contacts.

The invention further involves addition of inorganic compounds or organometallic compounds or mixtures thereof that react exothermically with molten aluminum or aluminum-silicon alloy (including Al-silicon eutectic alloy) or other aluminum alloys in the temperature range of 550 to 950° C. or 650 to 850° C. Organometallic oxide precursors decompose below aluminum melting point of ca. 660° C. and provide heat due to oxidation of the organic moiety in air. The inorganic metal oxide formed from the organometallic precursor decomposition reacts with molten aluminum at temperatures above 660° C. to provide excess heat which is useful to form reliable contacts.

Generally, the present invention includes a solar cell comprising a contact. The contact is made from a mixture wherein prior to firing, the mixture comprises at least one aluminum source, and about 0.1 to about 10 wt % of a glass component. The content of aluminum is about 60 wt % to about 95 wt % of the mixture.

The compositions and methods of the present invention overcome the drawbacks of the prior art by optimizing interaction, bonding, and contact formation between back contact (BSF) components, typically silicon with Al through a properly formulated aluminum paste. A conductive paste containing aluminum and a glass component is printed on a silicon substrate, and fired to fuse the glass, sinter the metal, and provide aluminum doping into the silicon wafer to a depth of several microns. One or more modifying oxides is added to the paste prior to firing in order to initiate an exothermic reaction to form a back contact including a p+ layer, which is overlaid by an Al—Si eutectic layer, and which in turn is overlaid by aluminum layer.

Broadly construed, the inventive pastes comprise aluminum, glass as well as a separate and distinct addition of a metal oxide. Each ingredient is detailed herein below.

Additives. The additives of interest herein provide at least one oxide of a metal selected from the group consisting of Ag, Al, Ba, Bi, Ca, Co, Cr, Cu, Fe, K, Li, Mg, Mn, Mo, Na, Nd, Ni, Sb, Si, Sn, Sr, Ta, V, Zn, Zr, and combinations thereof. Useful oxides herein include $KO_2$, $P_2O_5$, $MnO_2$, $K_2O$, $V_2O_5$, $Sb_2O_3$, $Ni_2O_3$, $Fe_2O_3$, $B_2O_3$, $GeO_2$, $CuO$, $Fe_3O_4$, $Mn_2O_3$, $MoO_2$, $CoO$, $CO_3O_4$, $Mo_2O_3$, $SnO_2$, $PbO_2$, $Cr_2O_3$, $GeO$, $Ga_2O_3$, $SiO_2$, $V_2O_3$, $Na_2O$, $In_2O_3$, $Sb_2O_5$, $ZnO$, $WO_3$, $Bi_2O_3$, $NiO$, $Pb_3O_4$, $Ag_2O$, $MnO$, $SnO$, $TiO_2$, $VO$, $Ta_2O_5$, $PbO$, $ZrO_2$, $Al_2O_3$ and their combinations. Any oxide of the metals in this paragraph or other compositions that ultimately provide such oxides are envisioned herein.

Paste Glasses.

The pastes comprise about 0.1 to about 10 wt %, preferably 0.2 to about 5 wt % of a glass component. The glass component comprises, prior to firing, one or more glass compositions. Each glass composition comprises oxide frits including, in one embodiment, $Bi_2O_3$, $B_2O_3$ and $SiO_2$. In another embodiment, the glass composition comprises an alkali oxide, $TiO_2$, and $SiO_2$. In particular, in various embodiments of the present invention, glass compositions for back contacts may be found in Tables 1-2. In formulating the pastes, the glass frits typically have particle sizes of about 0.5 to about 10 microns, although other particle sizes may be used as known in the art.

Looking to Tables 1-2, more than one glass composition can be used, and compositions comprising amounts from different columns in the same table are also envisioned. If a second glass composition is used, the proportions of the glass compositions can be varied to control the extent of paste interaction with silicon and hence the resultant solar cell properties, and to control the bowing of the silicon wafer. For example, within the glass component, the first and second glass compositions may be present in a weight ratio of about 1:20 to about 20:1, and preferably about 1:5 to about 5:1. The glass component preferably contains no lead or oxides of lead, and no cadmium or oxides of cadmium. However, in certain embodiments where the properties of PbO cannot be duplicated, such embodiments advantageously comprise PbO. An entry such as "$Li_2O+Na_2O+K_2O$" means that the total content of $Li_2O$ and $Na_2O$ and $K_2O$ falls within the specified ranges. For example, a range of 5-35 mol % ($Li_2O+Na_2O+K_2O$) includes 15-25 mol % $K_2O$, for example.

TABLE 1

Oxide frit ingredients for contact glasses in mole percent.

|  | Glass I | Glass II | Glass III | Glass IV |
|---|---|---|---|---|
| Bi2O3 | 20-55 |  |  |  |
| Al2O3 |  |  |  | 0.5-2.5 |
| $B_2O_3$ | 1-10 | 10-25 |  | 10-30 |
| $K_2O$ | 10-35 | 0.5-3.0 | 5-15 | 0.2-2.0 |
| $Li_2O$ |  |  | 1-8 |  |
| $Na_2O$ |  | 0.01-3.0 | 16-28 | 5-15 |
| $P_2O_5$ |  |  | 0.2-8 |  |
| $SiO_2$ | 10-50 | 70-90 | 30-50 | 16-26 |
| $TiO_2$ |  |  | 15-25 | 1-5 |
| $V_2O_5$ |  |  | 1-16 |  |
| ZnO |  |  |  | 21-31 |
| $ZrO_2$ |  |  |  | 1-5 |
| F2 |  |  |  | 0.5-15 |

TABLE 2

Oxide frit ingredients for contact glasses in mole percent.

|  | A | B | C | D | E | F | G | H | I | J | K |
|---|---|---|---|---|---|---|---|---|---|---|---|
| $Bi_2O_3$ | 50-70 | 45-75 | 60-90 | 15-40 | 15-55 | 20-50 | 25-45 | 45-75 | 15-55 | 20-50 | 10-40 |
| $SiO_2$ | 25-45 | 20-40 | 10-30 | 25-60 | 15-55 | 20-50 | 25-45 | 20-40 | 15-55 |  | 30-68 |
| ZnO | 2-7 |  |  | 5-15 |  |  |  |  |  | 20-38 |  |
| $B_2O_3$ |  |  |  | 5-15 |  |  |  | 5-15 | 1-15 | 10-25 | 5-15 |
| $Al_2O_3$ |  | 5-15 |  |  | 1-15 | 2-12 | 3-10 |  |  |  |  |
| $V_2O_5$ |  |  | 1-10 |  |  |  |  |  |  |  |  |
| $Li_2O$ |  |  |  | 5-15 |  |  |  |  |  |  | 1-10 |
| $Na_2O$ |  |  |  | 0.5-5 |  |  |  |  |  |  |  |
| $K_2O$ |  |  |  |  |  |  |  |  |  | 0.1-15 | 1-10 |

TABLE 2-continued

Oxide frit ingredients for contact glasses in mole percent.

| | A | B | C | D | E | F | G | H | I | J | K |
|---|---|---|---|---|---|---|---|---|---|---|---|
| Li$_2$O + Na$_2$O + K$_2$O | | | | | 5-35 | 10-30 | 15-25 | | 5-35 | | |
| TiO$_2$ | | | | | | | | | | | 0.1-5 |
| Nb$_2$O$_5$ | | | | 0.1-5 | | | | | | | |

The invention demonstrates that certain oxides or combinations of oxides, in various forms (glass, clays, silicates, inorganic pigments), which upon reacting with molten aluminum metal during solar cell contact firing, will provide excess heat which helps to form a better aluminum to silicon contact.

The following oxides provide excess heat when added to aluminum paste in order of decreasing effectiveness based on per gram of oxide reacted at 700° C.: KO$_2$ (most Heat), P$_2$O$_5$, MnO$_2$, K$_2$O, V$_2$O$_5$, Sb$_2$O$_3$, Ni$_2$O$_3$, Fe$_2$O$_3$, B$_2$O$_3$, GeO$_2$, CuO, Fe$_3$O$_4$, Mn$_2$O$_3$, MoO$_2$, CoO, Co$_3$O$_4$, Mo$_2$O$_3$, SnO$_2$, PbO$_2$, Cr$_2$O$_3$, GeO, Ga$_2$O$_3$, SiO$_2$, V$_2$O$_3$, Na$_2$O, In$_2$O$_3$, Sb$_2$O$_5$, ZnO, WO$_2$, Bi$_2$O$_3$, NiO, Pb$_3$O$_4$, Ag$_2$O, MnO, SnO, TiO$_2$, VO, Ta$_2$O$_5$, PbO, ZrO$_2$, Al$_2$O$_3$, (least heat).

Expressed differently, the following oxides provide excess heat when added to aluminum paste in order of decreasing effectiveness based on per gram of molten aluminum reacted at 700° C.: Ag$_2$O, PbO$_2$, Ni$_2$O$_3$, CO$_2$O$_3$, CuO, KO$_2$, Pb$_3$O$_4$, Sb$_2$O$_3$, Bi$_2$O$_3$ PbO, K$_2$O, NiO, CoO, P$_2$O$_5$, MnO$_2$, K$_2$O, Mo$_2$O$_3$, Sb$_2$O$_5$, MnO$_2$, GeO, SnO, SnO$_2$, GeO$_2$, Fe$_3$O$_4$, MoO$_2$, WO$_2$, In$_2$O$_3$, V$_2$O$_5$, P$_2$O$_5$, Mn$_2$O$_3$, ZnO, Ga$_2$O$_3$, Na$_2$O, Cr$_2$O$_3$, NbO$_2$, MnO, NbO, V$_2$O$_3$, Ta$_2$O$_5$, B$_2$O$_3$, VO, SiO$_2$, TiO$_2$, ZrO$_2$, Al$_2$O$_3$, BaO, SrO, MgO, La$_2$O$_3$, Li$_2$O, CaO, Y$_2$O$_3$, BH$_3$O$_3$.

In general, addition of transition metal oxides to an aluminum paste serves to generate heat. The oxides may come in the form of glass. Certain oxides such as cobalt oxide, manganese oxide, nickel oxide, iron oxide, silicon oxide, tin oxide, antimony oxide, silicon oxide, bismuth oxide, lead oxide, tin oxide or mixes their of with or without additional minerals or glasses are particularly advantageous. The oxides of bismuth, cobalt and vanadium have been found by the inventors to be particularly useful in this regard. Organometallic compounds such as metal acetyl acetonates or metal acetates can serve the same purpose. In general, addition of transition metal oxides to an aluminum paste serves to generate heat. The oxides may come in the form of glass. Certain oxides such as cobalt oxide, manganese oxide, nickel oxide, iron oxide, silicon oxide, tin oxide, antimony oxide, silicon oxide, bismuth oxide, lead oxide, tin oxide or mixes their of with or without additional minerals or glasses are particularly advantageous. The oxides of bismuth, cobalt and vanadium have been found by the inventors to be particularly useful in this regard. Organometallic compounds such as metal acetyl acetonates or metal acetates can serve the same purpose. The inventors herein have found that the addition of following glasses with or without the aforementioned additives serve to generate heat: LF256, EG2755, GL4317, all of which are commercially available Ferro Corporation products.

A mixing method is envisioned where one or more glasses, oxides, clays, pigments or silicates are well mixed with a sufficient amount of aluminum powder to have intimate contact between the reagents. This mixture is added to the aluminum paste to generate uniform heat and improve aluminum paste contact properties.

The present invention also provides an aluminum paste for application to a silicon solar cell having a p+ and n+ layer for the formation of a back-surface-field (BSF) and an emitter. Addition of various oxides to aluminum during firing provides additional heat to more thoroughly and uniformly sinter the contact.

Metal Component.

Solar cell contacts typically include silver, aluminum or both. In a back contact, the metal component comprises aluminum. The aluminum metal component may come in any suitable form, including aluminum metal powder, an alloy of aluminum, an aluminum salt, and organometallic aluminum, an oxide of aluminum, and an aluminum-containing glass. The aluminum particles used in the paste may be spherical, flaked, or provided in a colloidal suspension, and combinations of the foregoing may be used. In formulating the pastes, the metal powders typically have particle sizes of about 0.1 to about 40 microns, preferably less than 10 microns. For example the paste may comprise about 80 to about 99 wt % spherical aluminum particles or alternatively about 75 to about 90 wt % aluminum particles and about 1 to about 10 wt % aluminum flakes. Alternatively the paste may comprise about 75 to about 90 wt % aluminum flakes and about 1 to about 10 wt % of colloidal aluminum, or about 60 to about 95 wt % of aluminum powder or aluminum flakes and about 0.1 to about 20 wt % of colloidal aluminum. Suitable commercial examples of aluminum particles are available from Alcoa, Inc., Pittsburgh, Pa.; Ampal Inc., Flemington, N.J.; and ECKA Granulate GmbH & Co. KG, of Fürth, Germany.

An alloy of aluminum may be used, including those comprising aluminum and another metal. Metals such as boron, silicon, gallium, indium, antimony, and magnesium are advantageous. In one embodiment, the alloy provides both aluminum and boron, namely, as an aluminum-boron alloy, which comprises about 60 to about 99.9 wt % aluminum and about 0.1 to about 40 wt % boron. In a preferred embodiment an aluminum-boron alloy containing 0.2 weight % B could be used for up to 98 wt % of the paste mixture to provide both aluminum and boron to the mixture. In yet another preferred embodiment, one or more of the alloys Al—Si, Al—Mg, Al—Ga, Al—In, Al—Sb, Al—Sn, and Al—Zn may constitute up to about 50 wt % of the mixture, preferably 0.1 to 40%, more preferably 0.2-30%. The use of an aluminum alloy which reduces the solidification temperature of Aluminum-Silicon alloy is particularly advantageous as they reduce the bow by reducing thermal stress. Aluminum alloys containing Barium (Ba), Calcium (Ca), Strontium (Sr) and Cerium (Ce) can be used in the inventive compositions herein to impart the advantage of reduced bow.

The Al pastes herein can be used to form a p$^+$ BSF several microns thick with an active peak doping concentration of about $10^{19}$ to about $10^{20}$ atoms per cm$^3$; that is, one or two orders of magnitude higher than is achievable with conventional Al paste (e.g., on the order of $10^{18}$ atoms per cm$^3$).

Organic Vehicle.

The pastes herein include a vehicle or carrier which is typically a solution of a resin dissolved in a solvent and, frequently, a solvent solution containing both resin and a thixotropic agent. The organics portion of the pastes comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and/or wetting agent is also envisioned. Although a variety of weight ratios of the solids portion to the organics portion are possible, one embodiment includes a weight ratio of the solids portion to the organics portion from about 20:1 to about 1:20, preferably about 15:1 to about 1:15, and more preferably about 10:1 to about 1:10.

Ethyl cellulose is a commonly used resin. However, resins such as ethyl hydroxyethyl cellulose, wood rosin, mixtures of ethyl cellulose and phenolic resins, polymethacrylates of lower alcohols and the monobutyl ether of ethylene glycol monoacetate can also be used. Solvents having boiling points (1 atm) from about 130° C. to about 350° C. are suitable. Widely used solvents include terrenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on aluminum, or boron, to modify the contact. N-Diffusol® is a stabilized liquid preparation containing an n-type diffusant with a diffusion coefficient similar to that of elemental phosphorus. Various combinations of these and other solvents can be formulated to obtain the desired viscosity and volatility requirements for each application. Other dispersants, surfactants and rheology modifiers, which are commonly used in thick film paste formulations, may be included. Commercial examples of such products include those sold under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.).

Among commonly used organic thixotropic agents is hydrogenated castor oil and derivatives thereof. A thixotrope is not always necessary because the solvent coupled with the shear thinning inherent in any suspension may alone be suitable in this regard. Furthermore, wetting agents may be employed such as fatty acid esters, e.g., N-tallow-1,3-diaminopropane dioleate; N-tallow trimethylene diamine diacetate; N-coco trimethylene diamine, beta diamines; N-oleyl trimethylene diamine; N-tallow trimethylene diamine; N-tallow trimethylene diamine dioleate, and combinations thereof.

Other Additives.

Other inorganic additives may be added to the paste to the extent of about 1 to about 30 wt %, preferably about 2 to about 25 wt % and more preferably about 5 to about 20 wt % based on the weight of the paste prior to firing. Other additives such as clays, fine silicon, silica, or carbon powder, or combinations thereof can be added to control the reactivity of the aluminum and boron with silicon. Common clays which have been calcined are suitable. Fine particles of low melting metal additives (i.e., elemental metallic additives as distinct from metal oxides) such as Pb, Bi, In, Ga, Sn, Sb, and Zn and alloys of each with at least one other metal can be added to provide a contact at a lower firing temperature, or to widen the firing window.

Paste Preparation.

The paste according to the present invention may be conveniently prepared on a planetary mixer. The amount and type of carriers utilized are determined mainly by the final desired formulation viscosity, fineness of grind of the paste, and the desired wet print thickness. In preparing compositions according to the present invention, the particulate inorganic solids and metal powders are mixed with the vehicle and dispersed with suitable equipment, such as a planetary mixer, to form a suspension, resulting in a composition for which the viscosity will be in the range of about 100 to about 500 kcps, preferably about 300 to about 400 kcps, at a shear rate of 9.6 $\sec^{-1}$ as determined on a Brookfield viscometer HBT, spindle 14, measured at 25° C.

Printing and Firing of the Pastes.

The inventive method of making a solar cell back contact comprises: (1) applying an Al containing paste to the p-side of a silicon wafer on which back silver rear contact paste is already applied and dried, (2) drying the paste, and (3) applying the front contact silver paste, and (4) co-firing the front contact, silver rear contact, and Al back contact. The solar cell printed with silver rear contact Ag-paste, Al back contact paste, and Ag-front contact paste is fired at a suitable temperature, such as about 650-950° C. furnace set temperature; or about 550-850° C. wafer temperature. During firing as the wafer temperature rises above the Al—Si eutectic temperature of 577° C., the back contact Al dissolves Si from the substrate and a liquid Al—Si layer is formed. This Al—Si liquid continues to dissolve substrate Si during further heating to peak temperature. During the cool down period, Si precipitates back from the Al—Si melt. This precipitating Si grows as an epitaxial layer on the underlying Si substrate and forms a p+ layer. When the cooling melt reaches the Al—Si eutectic temperature the remaining liquid freezes as an Al—Si eutectic layer. A p+ layer is believed to provide a back surface field (BSF), which in turn increases the solar cell performance.

Method of Back Contact Production.

A solar cell back contact according to the present invention can be produced by applying any Al paste disclosed elsewhere herein, produced by mixing aluminum powders, with the glass compositions of any table of glass formulations herein to the P-side of the silicon substrate pre-coated with silver rear contact paste, for example by screen printing, to a desired wet thickness, e.g., from about 30 to 50 microns. Front contact Ag pastes are then printed on the front side.

Common to the production of front contacts, back contacts and silver rear contacts is the following. Automatic screen-printing techniques can be employed using a 200-325 mesh screen. The printed pattern is then dried at 200° C. or less, preferably at about 120° C. for about 5-15 minutes before firing. The dry printed Al back contact paste of the present invention can be co-fired with the silver rear contact and the front contact silver pastes for as little as 1 second up to about 5 minutes at peak temperature, in a belt conveyor furnace in air.

Nitrogen ($N_2$) or another inert atmosphere may be used if desired, but it is not necessary. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures. For example a three-zone firing profile may be used, with a belt speed of about 1 to about 4 meters (40-160 inches) per minute. Naturally, firing arrangements having more than 3 zones are envisioned by the present invention, including 4, 5, 6, or 7, zones or more, each with zone lengths of about 5 to about 20 inches and firing temperatures of 650 to 1000° C.

Examples

Exemplary Al formulations in Table 3 were made with commercially available glasses from Ferro Corporation, Cleveland, Ohio. Commonly available 4-10 micron aluminum powders were used.

TABLE 3

Exemplary Aluminum-Exothermic Oxide overall Paste Formulations

| | Formula (wt %) | |
|---|---|---|
| Ingredient | Paste I | Paste II |
| V-384 | 4.77 | 0.1 |
| V-431 | 7.00 | |
| V-616 | | 3.11 |
| Cobalt Oxide, $Co_3O_4$ | 0.40 | 0.41 |
| Glass I* | 0.2 | 0.17 |
| EG 2755* | 0.8 | 0.69 |
| Texanol | 7.50 | 14.59 |
| Lubrhophos LK500 | 0.25 | |
| Disperbyk 111 | 0.25 | |
| Al monostearate | 1.50 | 1.55 |
| Aluminum 4-6 µm | 77.33 | 79.37 |
| Total | 100.00 | 100.00 |

*Glasses were added by preparing a premix of two glasses, vehicles and an aluminum powder as described below.

Table 3 shows the overall paste compositions for exemplary aluminum paste formulations prepared using cobalt oxide ($Co_3O_4$) as an oxide additive to provide excess heat. Glass I and EG2755 were added by preparing a homogeneous premix with vehicles. Disperbyk® is commercially available from BYK-Chemie GmbH, Wesel, Germany. Vehicle 431 is a blend of 80% Texanol®, 10% Acryloid B-67 and 10% Elvacite #2045. Vehicle 384 (V-384) is a blend of 91.2% Texanol®, 8% Dow Ethyl cellulose Premium Standard #4, and 0.8% Thixatrol ST. Vehicle 494 (V-494) is a blend of 82.8% Texanol® and 17.2% Dow Ethyl cellulose Premium Standard #4. Vehicle 616 (V-616) is a blend of 87.2% Texanol® and 9.48% Dow Ethyl cellulose Premium Standard #100, and 3.32% Thixatrol ST. Cobalt 10M (Co 10M) is a blend of 80% cobalt oxide and 20% Vehicle 384. Glass I and Glass EG2755 premix A for Paste I was prepared by mixing 30.03 wt % Vehicle 384, 39.94 wt aluminum powder 6.01 wt % of Glass I frit and 24.02 wt % Ferro Glass frit EG 2755. In mole percent, Glass I is 35.8% $Bi_2O_3$, 35.5% $SiO_2$, 7.2% $B_2O_3$ and 21.5% $K_2O$. Total of 3.33 grams of premix A were added to Paste I to obtain 0.2 grams of Glass 1 and 0.8 grams of EG 2755 as shown in Table 3. For the Paste II, a homogeneous heat mix was prepared by mixing 23.83 wt % Vehicle 616, 20.64 wt % Texanol, 24.68 wt % Aluminum powder 6.17 wt % of Glass I frit and 24.68 wt % Ferro Glass fit EG 2755 Total of 2.82 grams of premix B were added to paste II to obtain 0.17 grams of Glass I and 0.69 grams of EG 2755 as shown in Table 3. Premix compositions are shown below in Table 4.

TABLE 4

Glass Premix compositions.

| | Glass Premix A for Paste I | Glass Premix B for Paste II |
|---|---|---|
| V-384 | 30.03 | |
| V-616 | | 23.83 |
| Texanol | | 20.64 |
| Aluminum 4-6 µm | 39.94 | 24.68 |
| Glass I | 6.01 | 6.17 |
| EG2755 | 24.02 | 24.68 |
| Total | 100 | 100 |

Prior art aluminum pastes (commercially available Ferro CN53-101, and 53-200) were fired side by side for comparison with pastes representing embodiments of the invention. All Al pastes were printed on 6 inch diameter (182 $cm^2$) silicon polycrystalline wafers having a thickness of 200 microns, using 250 mesh screen. For front silver, NS 33-510 paste using a 325 mesh screen was printed. Photovoltaic cells were fired in a Despatch furnace using profile 400-400-500-700-800-920° C. @ 200 ipm. Electrical performance of some of these solar cells was measured with a solar tester, Model 91193-1000, Oriel Instrument Co., Stratford, Conn., under AM 1.5 sun conditions, in accordance with ASTM G-173-03. The electrical properties of the resultant solar cells are set forth in Table 5, which shows typical solar cell electrical properties and bowing for similar wafers for comparison of a prior art Al paste and an Al paste of the invention.

TABLE 5

Comparison of Al—B paste fired back contact with prior art Al back contact.

| Lot Name | Type of paste | PV_No | Jsc | Isc | Voc | Bowing (mm) | Bow/Al wt (mm/g) |
|---|---|---|---|---|---|---|---|
| CN53-200 | Prior art | 1 | 0.03237 | 7.87602 | 0.60737 | 0.559 | 0.3765 |
| CN53-101 | Prior art | 5 | 0.03262 | 7.93693 | 0.61113 | 0.927 | 0.5638 |
| I | inventive | 2 | 0.03275 | 7.96949 | 0.61091 | 1.511 | 0.9715 |
| II | inventive | 7 | 0.03267 | 7.94932 | 0.60997 | 1.7085 | 0.9626 |

Differential Thermal Analysis of several exemplary glass-metal compositions were run to determine the heat contribution of glasses or oxide additives to a glass-aluminum sintering reaction scheme. Sample sizes were typically about 35 or 65 milligrams depending on the exothermic peak temperature rise. The peak position reveals whether the additive contributes heat before the melt point of aluminum is reached, (meaning it does not have an effect on the Al-glass reaction and does not assist in forming a uniform contact), or after the melt point of aluminum is reached, meaning it contributes heat to the Al-glass reaction and assists in making a uniform contact. The results of selected DTA runs are summarized in Table 6 for the effect of Cobalt oxide ($Co_3O_4$) on the exothermic peak temperature using Glass I. DTA study was conducted by premixing ingredients described in Table 6 with the ratios indicated.

TABLE 6

Highlights of select DTA runs for combinations of glass, aluminum and oxide additives. DTA Sample size was about 65 milligrams.

| Products (wt ratio if given) | Peak Position (° C.) | Comments |
|---|---|---|
| Glass I | 509.63 | DTA peak due to glass crystallization |
| Aluminum | 610.24 | Aluminum oxidation before melting |
| $Co_3O_4$ | 930.52 | Endothermic, melting of oxide |
| Al + $Co_3O_4$(1:1) | 602.41 | Reaction before melting of aluminum |
| Glass I + Al (5:1) | 814.64 | Reaction between molten Al and glass |
| Glass I + Al + $Co_3O_4$ (5:1:1) | 715 | Lower exothermic peak temperature than 814.64° C. without $Co_3O_4$ additive |

As summarized in Table 6, the DTA plots of various pastes reveal that glass is required to initiate a reaction between cobalt oxide and aluminum metal in a paste printed on a back contact. Cobalt acetate provides significant heat during decomposition. There is no chemical reaction between the cobalt source and molten aluminum when glass is not present. Glass I by itself reacts with molten Al to liberate heat. The heat of the Glass I reaction with molten aluminum can be further increased by additions of cobalt oxide. To achieve such benefits from cobalt, small portions of aluminum, glass and a cobalt source should be well mixed and then added to aluminum paste and them it should be well distributed. There appears to be glass to glass variation on effectiveness of oxide additive.

Tables 7, 8 and 9 summarize the effect of oxide additive on the decrease in the exothermic peak temperature of aluminum and glass mix. Table 7 shows the effect of various oxides on three example glasses and aluminum mixes on decreasing exothermic peak temperature compared to exothermic peak without addition of the selected oxide. Table 8 shows decreasing exothermic peak temperature with certain oxide additives for a glass mixture. Table 9 shows that the oxide as well as oxide precursor on decreasing exothermic peak temperature. It is anticipated that oxide additive mixtures can be also used to adjust exothermic peak temperature.

TABLE 7

Effect of oxide additive and glass selected on the DTA exothermic peak temperature. Amounts in grams.

| | | | | Exothermic peak temp (° C.) | | |
|---|---|---|---|---|---|---|
| Glass Amount | Aluminum Amount | Additive Amount | Oxide Additive | Glass EG2755 | Glass I | Glass GL4317 |
| 5 | 1 | 1 | $Ag_2O$ | | 710 | |
| 5 | 1 | 1 | $Co_3O_4$ | 760 | 715 | 721 |
| 5 | 1 | 1 | $Cr_2O_3$ | | 731 | |
| 5 | 1 | 1 | CuO | | 743 | |
| 5 | 1 | 1 | $Fe_2O_3$ | | 775 | |
| 5 | 1 | 1 | NiO | | 745 | |
| 5 | 1 | 1 | $SiO_2$ | | 827 | |
| 5 | 1 | 1 | SnO | | 788 | |
| 5 | 1 | 1 | $V_2O_5$ | | 815 | |
| 5 | 1 | 0 | No Additive | 761 | 792 | 709 |

Glass I is more effective in decreasing the exothermic peak temperature by addition of $Ag_2O$, $Co_3O_4$, $Cr_2O_3$, CuO, $Fe_2O_3$, NiO and SnO to Glass I and Aluminum powder mix in the ratio of Glass I:Aluminum Powder:Oxide 5:1:1. This is compared to the exothermic peak of Glass I and Aluminum without oxide additive of 792 degrees Centigrade. DTA Sample weight was about 65 milligrams.

TABLE 8

Effect of oxide additive on the exothermic peak temperature with a glass mixture. The amounts are given in grams.

| Glass Mix Amount | Al Amount | Additive Amount | Additive | Peak Temp ° C. |
|---|---|---|---|---|
| 8 | 2 | 0 | No Additive | 833 |
| 8 | 2 | 1 | $Ag_2O$ | 793 |
| 8 | 2 | 1 | $Co_3O_4$ | 837 |
| 8 | 2 | 1 | $Cr_2O_3$ | 830 |
| 8 | 2 | 1 | CuO | 797 |
| 8 | 2 | 1 | $Fe_2O_3$ | 841 |
| 8 | 2 | 1 | NiO | 852 |
| 8 | 2 | 1 | $Pb_3O_4$ | 833 |
| 8 | 2 | 1 | Si | 805 |

Glass mix consists of EG2755 (34.5 wt %), Glass I (8.5 wt %), and GL4317 (57 wt %). Glass mix was further mixed with aluminum powder and oxide additive to perform DTA testing. DTA Sample weight was ~35 milligrams. Oxides such as $Ag_2O$, $Cr_2O_3$, and $SiO_2$ are effective in decreasing the exothermic peak temperature compared to exothermic peak temperature of 833° C.

Table 9: Table shows the effect of oxide and oxide precursor on the exothermic peak temperature with various glasses. As shown in the table oxide precursors such as Cobalt Acetate and Cobalt Acetylacetonate are equally effective in decreasing the exothermic peak temperature compared to glass and aluminum mix without the additive. DTA Sample weight was about 65 milligrams.

TABLE 9

Effect of oxides and oxide precursors on exothermic peak temperature with various glasses.

| | | | | Exothermic peak temp (° C.) | | |
|---|---|---|---|---|---|---|
| Glass Amount | Al Amount | Additive Amount | Additive | EG2755 | Glass I | GL4317 |
| 5 | 1 | 1 | $Co_3O_4$ | 760 | 715 | 721 |
| 5 | 1 | 1 | Co-Acetylacetonate | | 716 | 889 |
| 5 | 1 | 1 | Co-Acetate | | 703 | 910 |
| 5 | 1 | 0 | No Additive | 761 | 792 | 709 |

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:

1. A method of improving the electrical performance of an aluminum back contacted silicon solar cell, comprising:
   a. applying a paste to an uncoated surface of a silicon wafer substrate to form a coated substrate, the paste comprising:
      i. a metal component comprising about 60-95 wt % aluminum, based upon 100% total weight of the paste, ii. glass frit, and
iii. a separate and distinct amount of at least one oxide of a metal selected from the group consisting of Co, Cu, Fe, Ni, and combinations thereof, such that the paste having has an exothermic reaction peak, when measured with differential thermal analysis at a heating rate of 20° C. per minute in air, at a temperature of at least 660° C. to less than 900° C., with a sample size of 5 to 200 mg; and
b. firing the coated substrate for a time and at a temperature sufficient to sinter the aluminum and fuse the glass frit and at least one oxide.

2. The method of claim 1, wherein the glass frit comprises:
a. 20-55 mol % $Bi_2O_3$,
b. 10-50 mol % $SiO_2$,
c. 1-10 mol % $B_2O_3$, and
d. 5-35 mol % ($Li_2O+Na_2O+K_2O$).

3. The method of claim 1, wherein the glass frit comprises:
a. 10-25 mol % $B_2O_3$,
b. 0.5-3 mol % $K_2O$,
c. 0.01-3 mol % $Na_2O$ and
d. 70-90 mol % $SiO_2$.

4. The method of claim 1, wherein the glass frit comprises
a. 5-15 mol % $K_2O$,
b. 1-8 mol % $Li_2O$,
c. 16-28 mol % $Na_2O$,
d. 0.2-8 mol % $P_2O_5$,
e. 30-50 mol % $SiO_2$,
f. 15-35 mol % $TiO_2$,
g. 1-16 mol % $V_2O_5$.

5. The method of claim 1, wherein the glass frit comprises
a. 0.5-2.5 mol % $Al_2O_3$,
b. 10-30 mol % $B_2O_3$,
c. 0.2-2.0 mol % $K_2O$,
d. 5-15 mol % $Na_2O$,
e. 16-26 mol % $SiO_2$,
f. 1-5 mol % $TiO_2$,
g. 21-31 mol % ZnO,
h. 1-5 mol $ZrO_2$, and
i. 0.5-15 mol % $F_2$.

6. The method of claim 1, wherein the at least one oxide is cobalt oxide.

7. The method of claim 1, wherein a sufficient amount of the oxide is present in order to provide 100 ppmw to 10 wt % of the metal.

8. The method of claim 1, wherein a sufficient amount of the oxide is present in order to provide 500 ppmw to 8 wt % of the metal.

9. The method of claim 1, wherein a sufficient amount of the oxide is present in order to provide 1000 ppmw to 7 wt % of the metal.

10. The method of claim 1, wherein a sufficient amount of the at least one oxide is present in order to provide 0.05 wt % to 5 wt % of the metal.

11. A solar cell including a contact made by the method of claim 1.

12. A method of reducing the reaction temperature of a conductive paste sintering reaction, comprising:
a. applying a paste to an uncoated surface of a silicon wafer substrate to form a coated substrate, the paste comprising:
i. about 60-95 wt % aluminum, based upon 100% total weight of the paste,
ii. glass frit, and
iii. a separate and distinct amount of at least one oxide of a metal selected from the group consisting of Co, Cu, Fe, Ni, and combinations thereof, such that the paste has an exothermic reaction peak, when measured with differential thermal analysis at a heating rate of 20° C. per minute in air, at a temperature of at least 660° C. to less than 900° C., with a sample size of 5 to 200 mg; and
b. firing the coated substrate for a time and at a temperature sufficient to sinter the aluminum and fuse the glass frit and oxide,
wherein the combination of aluminum, glass frit and at least one oxide is such that the sintering temperature of the paste is at least 5° C. lower than it would otherwise be if the at least one oxide were not present.

13. The method of claim 12, wherein the combination of aluminum, glass frit and at least one oxide is such that the sintering temperature of the paste is at least 10° C. lower than it would otherwise be if the at least one oxide were not present.

14. The method of claim 12, wherein the combination of aluminum, glass frit and at least one oxide is such that the sintering temperature of the paste is at least 20° C. lower than it would otherwise be if the at least one oxide were not present.

15. A method of improving the electrical performance of an aluminum back contacted silicon solar cell, the method comprising:
a. applying a paste to an uncoated surface of a silicon wafer substrate to form a coated substrate, the paste comprising:
i. about 60-95 wt % aluminum, based upon 100% total weight of the paste,
ii. glass frit, and
iii. a separate and distinct amount of at least one oxide of a metal selected from the group consisting of Co, Cu, Fe, Ni, and combinations thereof, which, when tired, provides an exothermic enthalpy of 1 to 25 kilojoules per gram of paste aluminum reacted at 700° C. to form a coated substrate; and
b. firing the coated substrate for a time and at a temperature sufficient to sinter the aluminum and fuse the glass frit and oxide.

16. A solar cell comprising, prior to firing,
a. a silicon wafer substrate having an uncoated surface; and
b. a paste applied to the uncoated surface of the substrate, the paste comprising:
i. about 60-95 wt % aluminum, based upon 100% total weight of the paste,
ii. glass frit, and
iii. a separate and distinct amount of at least one oxide of a metal selected from the group consisting of Co, Cu, Fe, Ni, and combinations thereof, such that the paste has an exothermic reaction peak, when measured with differential thermal analysis at a heating rate of 20° C. per minute in air, at a temperature of at least 660° C. to less than 900° C., with a sample size of 5 to 200 mg,
wherein the combination of aluminum, glass frit and at least one oxide is such that the sintering temperature of the paste is at least 5° C. lower than it would otherwise be if the at least one oxide was not present.

17. A method of improving the electrical performance of an aluminum back contacted silicon solar cell, comprising:
a. applying a paste to an uncoated surface of a silicon wafer substrate to form a coated substrate, the paste comprising:
i. about 60-95 wt % aluminum, based upon 100% total weight of the paste, ii. glass frit, and
iii. a separate and distinct amount of a component that supplies at least one oxide of a metal selected from the group consisting of Co, Cu, Fe, Ni, and combinations thereof, such that the paste has an exothermic reaction peak, when measured with differential thermal analysis at a heating rate of 20° C. per minute in air, at a temperature of at least 660° C. to less than 900° C., with a sample size of 5 to 200 mg; and
b. firing the coated substrate for a time and at a temperature sufficient to sinter the aluminum and fuse the glass frit and at least one oxide.

* * * * *